(12) United States Patent
Wu et al.

(10) Patent No.: US 11,496,139 B2
(45) Date of Patent: Nov. 8, 2022

(54) FREQUENCY MEASUREMENT CIRCUIT WITH ADAPTIVE ACCURACY

(71) Applicant: Movellus Circuits Incorporated, Ann Arbor, MI (US)

(72) Inventors: Xiao Wu, Ann Arbor, MI (US); Jeffrey Fredenburg, Ann Arbor, MI (US)

(73) Assignee: Movellus Circuits, Inc., Ann Arbor, MI (US)

( * ) Notice: Subject to any disclaimer, the term of this patent is extended or adjusted under 35 U.S.C. 154(b) by 0 days.

(21) Appl. No.: 17/246,232

(22) Filed: Apr. 30, 2021

(65) Prior Publication Data

US 2021/0258013 A1  Aug. 19, 2021

Related U.S. Application Data

(63) Continuation-in-part of application No. 16/821,153, filed on Mar. 17, 2020, now Pat. No. 11,070,215, which is a continuation-in-part of application No. 16/006,927, filed on Jun. 13, 2018, now Pat. No. 10,594,323.

(51) Int. Cl.
*H03L 7/099* (2006.01)
*H03L 7/183* (2006.01)
*H03L 7/093* (2006.01)

(52) U.S. Cl.
CPC ............ *H03L 7/0992* (2013.01); *H03L 7/093* (2013.01); *H03L 7/183* (2013.01)

(58) Field of Classification Search
CPC ...................................... H03L 7/0992

USPC .......................................................... 331/18
See application file for complete search history.

(56) References Cited

U.S. PATENT DOCUMENTS

| | | |
|---|---|---|
| 5,999,060 A | 12/1999 | Zuta |
| 6,072,842 A | 6/2000 | Janesch |
| 6,218,876 B1 | 4/2001 | Sung |
| 6,275,553 B1 | 8/2001 | Esaki |
| 6,424,192 B1 | 7/2002 | Lee |
| 6,496,965 B1 | 12/2002 | van Ginneken |
| 6,744,324 B1 | 6/2004 | Adams |
| 6,826,247 B1 | 11/2004 | Elliott |
| 7,216,249 B2 | 5/2007 | Fujiwara |
| 8,117,576 B2 | 2/2012 | Mossawir |
| 8,321,489 B2 | 11/2012 | Staszewski |
| 8,427,205 B1 | 4/2013 | Nagaraj |
| 8,791,734 B1 | 7/2014 | Hara |
| 9,007,109 B2 | 4/2015 | Ba |
| 9,698,798 B1 | 7/2017 | Fredenburg |
| 2005/0189972 A1 | 9/2005 | Foo |
| 2007/0085622 A1 | 4/2007 | Wallberg |

(Continued)

*Primary Examiner* — Joseph Chang
(74) *Attorney, Agent, or Firm* — Lance Kreisman; Peninsula Patent Group (57) ABSTRACT

A frequency measurement circuit includes a counter circuit to receive a first digitally-controlled oscillator (DCO) clock signal corresponding to a first DCO input codeword and a measurement signal. The counter circuit is responsive to the measurement signal to generate a count representing a measured frequency of the first DCO clock signal. A control circuit is configured to selectively adjust a parameter of the measurement signal for generating a second count of a second DCO clock signal corresponding to a second DCO codeword. The control circuit selectively adjusts the parameter based on a received control signal.

18 Claims, 10 Drawing Sheets

(56) References Cited

U.S. PATENT DOCUMENTS

| | | | |
|---|---|---|---|
| 2010/0073048 A1* | 3/2010 | Ke | ............... H03L 7/093 |
| | | | 327/157 |
| 2010/0244971 A1* | 9/2010 | Wang | ............ G04F 10/005 |
| | | | 331/1 A |
| 2013/0120036 A1 | 5/2013 | Zhu | |
| 2013/0300477 A1 | 11/2013 | Ueda | |
| 2015/0188547 A1* | 7/2015 | Lu | ............. H03L 7/0992 |
| | | | 327/159 |
| 2016/0036454 A1 | 2/2016 | Moehlmann | |
| 2016/0204787 A1 | 7/2016 | Lotfy | |
| 2017/0193136 A1 | 7/2017 | Prasad | |
| 2020/0076439 A1 | 3/2020 | Weeks | |

* cited by examiner

FREQUENCY MEASUREMENT CIRCUIT WITH ADAPTIVE ACCURACY

CROSS-REFERENCE TO RELATED APPLICATIONS

This application is a Continuation-In-Part that claims priority to U.S. application Ser. No. 16/821,153, filed Mar. 17, 2020, titled LOCKED LOOP CIRCUIT AND METHOD WITH DIGITALLY-CONTROLLED OSCILLATOR (DCO) GAIN NORMALIZATION, which is a Continuation-In-Part that claims priority to U.S. application Ser. No. 16/006,927, filed Jun. 13, 2018, titled LOCKED LOOP CIRCUIT AND METHOD WITH DIGITALLY-CONTROLLED OSCILLATOR (DCO) GAIN NORMALIZATION, all of which are incorporated herein by reference in their entirety.

TECHNICAL FIELD

The disclosure herein relates to locked loop circuits, and more particularly digital locked-loop circuits with adjustable parameters in response to changing environmental conditions.

BACKGROUND

Locked loop circuits, such as phase-locked loops, typically generate timing signals relative to an input reference signal. The locked loop circuitry adjusts the frequency of an output signal based on frequency and/or phase differences between the reference signal and the output signal. Based on any such difference, the frequency and/or phase of the output signal is increased or decreased accordingly. Phase-locked loops are used in a wide range of electronics, such as radios, telecommunication circuits, wireless and mobile devices, computers, and other devices.

Digital phase-locked loops often employ a digitally-controlled oscillator (DCO) that converts an input digital word received from a loop filter into a periodic signal output at a given frequency. Functionally, conventional DCO circuits generate the periodic output using a digital-to-analog frequency mapping curve that acts as a function applied to the input digital word from the loop filter. Under various operating conditions, such as those involving process, voltage or temperature (PVT) variations, the frequency mapping curve may exhibit gain variation referred to as DCO gain variation, which in turn may introduce error in the frequency and/or phase of the output signal.

Accordingly, what is needed are methods, systems and associated apparatus that allow for compensating for DCO gain variations in a straightforward, efficient and predictable manner.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of locked-loop circuits and methods are provided. In one embodiment, a method of operation in a locked-loop circuit. The locked-loop circuit includes a loop filter and a digitally-controlled oscillator (DCO). The loop filter includes a first input to receive a digital word representing a difference between a reference clock frequency and a DCO output frequency. The loop filter includes internal storage. The method includes selecting a desired DCO output frequency that is generated in response to a calibration DCO codeword. A start value is retrieved from the loop filter internal storage. The start value corresponds to the calibration DCO codeword. The locked-loop circuit is then started with the retrieved start value.

Figure 1:
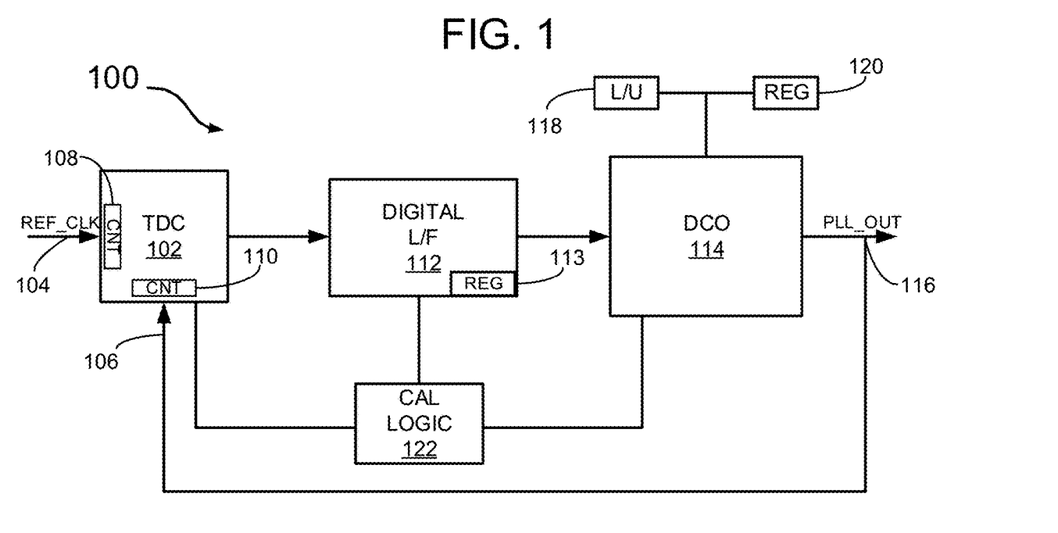
FIG. 1 illustrates one embodiment of a digital phase-locked loop (PLL).

FIG. 1 illustrates one embodiment of a digital phase-locked loop (PLL), generally designated 100, that may be used to generate a desired output timing signal, such as a clock signal. The PLL includes a time-to-digital converter (TDC) 102 that receives as inputs a periodic reference clock signal REF CLK, at 104, and a PLL clock output signal PLL OUT, at 106. Each of the clock input signals drive counter circuits 108, 110, which generate digital count values corresponding to the input signal frequencies. The TDC further includes a phase detector that includes comparison circuitry (not shown) to compare the frequency counts of the two counters, and generate a difference count value in the form of a multi-bit digital word. The difference count and resulting multi-bit digital word thus represents a phase difference between the reference clock signal and the PLL clock output signal.

With continued reference to FIG. 1, a digital loop filter 112 receives the output digital word from the TDC 102, representing the phase difference between the TDC input clocks, and employs processing circuitry to apply one or more digital filtering techniques to smooth the multi-bit digital word. The processing circuitry may include register circuitry to store values of integral Ki and proportional Kp gain constants employed in the digital filtering technique. Some embodiments may employ additional constants to extend the filtering to higher orders. Additional accumulators and/or internal storage in the form of temporary registers 113 may be employed to store retrievable settings of start codeword values, phase values, or quiescent state values for internal loop filter control values. For one embodiment, explained more fully below, a scaling factor may be applied to one or both of the integral Ki and proportional Kp gain constants. The output of the digital loop filter is then fed to a digitally-controlled oscillator (DCO) 114.

Further referring to FIG. 1, the DCO 114 generally serves as a digital-to-frequency converter, receiving the smoothed digital output word from the loop filter 112, and applying one of a set of predefined DCO codewords that match closest to the received digital output word from the loop filter. The applied DCO codeword corresponds to a desired output frequency. The DCO uses the codeword to control the oscillator which in turn generates a frequency that corresponds to the codeword in an approximate sense. A periodic output signal is produced by, for example, a crystal oscillator, based on the value of the DCO codeword, and provided to an output node, at 116. The ratio between a change in frequency resulting from a change in the DCO codeword is referred to herein as DCO gain. Ways to determine and normalize DCO gain are explained below. The output timing signal PLL_OUT is then fed back to the TDC 102 to complete a control loop, and may also be distributed to other circuits needing a clock signal. The local storage may also provide initial settings for DCO operation as more fully described below.

With continued reference to FIG. 1, for one embodiment, the PLL 100 employs calibration circuitry 122 in the form of logic to manage DCO gain normalization operations, and to provide beneficial frequency and phase initialization operations, each of which are more fully described below. The calibration circuitry is generally coupled to control the normalization/initialization operations applied to the TDC, loop filter and DCO. In one embodiment, the calibration circuitry may employ state machine hardware such as a time-multiplexed multiplier and divider circuit to perform various arithmetic operations described herein. For some embodiments, the state machine hardware may be incorporated in any of the PLL circuit modules, such as the loop filter, or distributed throughout the various modules.

Figure 2:
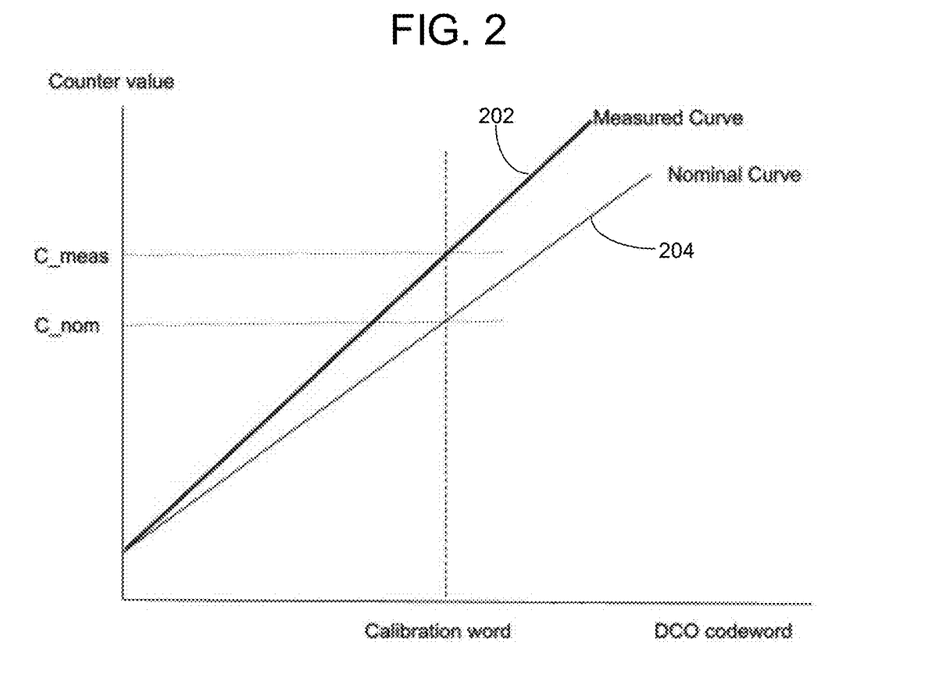
FIG. 2 illustrates a graph plotting a measured DCO gain versus a nominal DCO gain.

In some situations, an expected frequency resulting from application of the selected DCO codeword differs significantly from an actual frequency. This is often the case for physical implementations of the PLL on an actual semiconductor chip. FIG. 2 illustrates respective nominal and measured curves, at 202 and 204, that plot digital count values (y-axis), against selected DCO codeword values (x-axis). The nominal curve 204 plots an expected frequency (in terms of count value) versus the DCO codeword. The slope of the nominal curve 204 thus represents a nominal DCO gain, representing a change in count value (corresponding to output frequency) for each least-significant-bit (LSB) change in the DCO codeword. Similarly, the measured curve 202 represents a measured gain, or change in count value for each incremental change in the DCO codeword (for example, where a single bit change in the codeword leads to a change in frequency). In order to compensate for the change in measured versus expected DCO operation due to, for example, process-voltage-temperature (PVT) effects, a DCO gain normalization process or calibration may be performed, as explained below.

Generally, for one embodiment, the DCO gain normalization process determines the run-time scaling factor, $K_{scale}$ that may be applied to the PLL loop filter gain constants, $K_i$ and $K_p$, to map them to a nominal or expected DCO gain that was used to calculate the unmodified $K_i$ and $K_p$ values. This mapping of the run-time constants to the nominal gain eliminates or significantly reduces the gain variation associated with PVT (process, voltage, and temperature). The DCO gain normalization may be simplified based upon the following assumptions:

i) The nominal and measured gain curves are linear, or approximately linear.

ii) Being within a predefined percentage of error is acceptable.

iii) That the minimum counter value for all gain curves corresponds to a zero frequency value, and can be approximated to being the same without a significant loss in accuracy.

Figure 3:
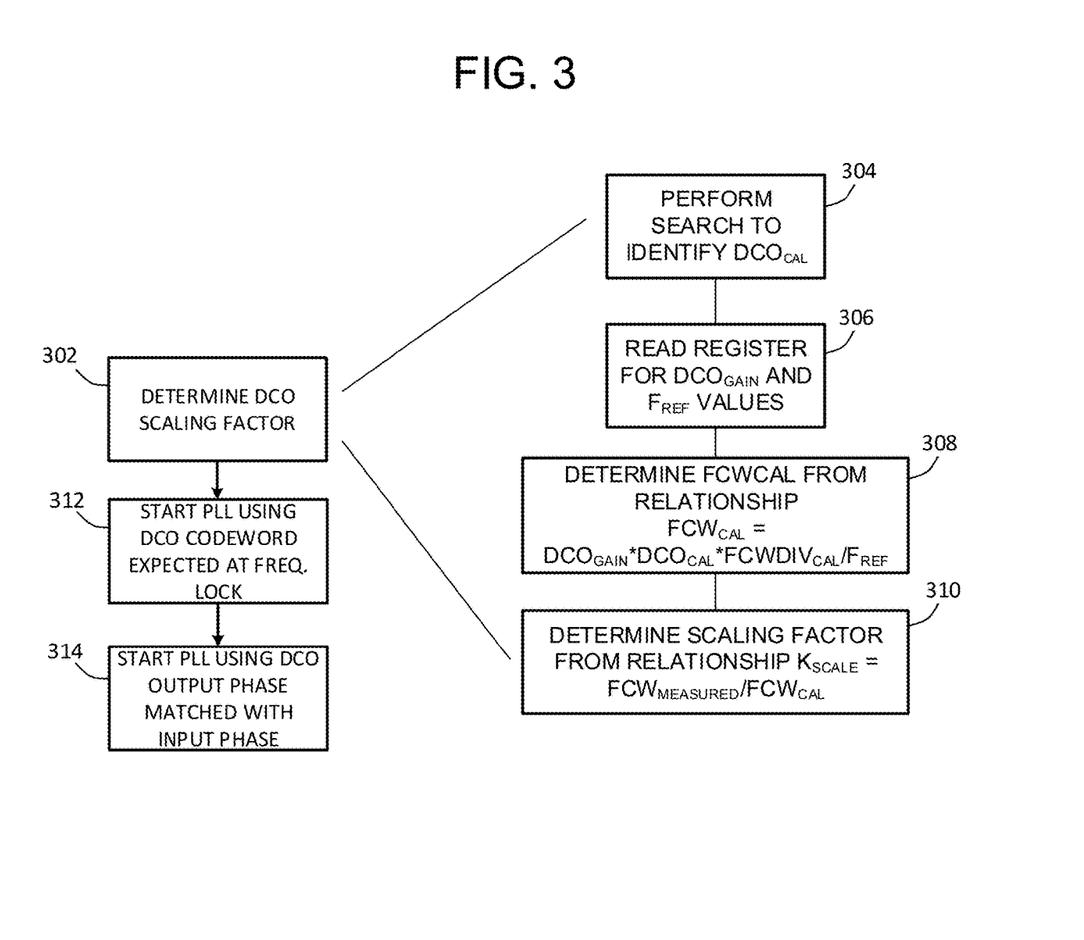
FIG. 3 illustrates a flowchart of steps illustrating one embodiment of a method of operating a PLL such as that shown in FIG. 1.

FIG. 3 illustrates steps employed in one embodiment of a method for determining a DCO scaling factor in a DCO gain normalization process, at 302. The DCO gain normalization process may be carried out during an initialization or calibration mode of operation and generally involves first determining a DCO operating point by identifying the DCO codeword, $DCO_{cal}$, that causes the DCO to produce a desired output frequency, at 304. For one embodiment, determining $DCO_{cal}$ involves carrying out a search routine, such as a modified binary search, to look for a selectable DCO codeword value that produces the closest output frequency to the desired output frequency. This is referred to as the "operating point" on the DCO gain curve. To prevent generating DCO frequencies that are out of the operational range of the circuit, PVT variations should be accounted-for when choosing the $DCO_{cal}$ value. One embodiment provides for up to 8× PVT variation in the DCO gain range. The calibration logic 122 (FIG. 1) assumes that the PLL circuit has closed timing at the FCW value specified at run-time, or is an operationally safe value. The FCW value represents the ratio of the frequency at the PLL output 116 to the frequency of the reference clock 104. The DCO control word is iteratively set and the output frequency of the PLL circuit is checked to determine whether the output frequency is less than the desired output frequency. Expressed as frequency control word values that represent the ratio of the PLL output frequency to the reference frequency, this is equivalent to checking whether the measured output frequency expressed as a ratio to the reference frequency, the $FCW_{measured}$ value, is less than the desired run-time frequency expressed as a ratio to the reference frequency, FCW. This tells us that we are driving the DCO and therefore the DCO clock at close to the expected frequency for the application, but not exceeding the application frequency and therefore are not generating unexpected timing violations. This search function determines the DCO codeword value that we used during calibration, $DCO_{cal}$.

Once the DCO operating point has been determined, at 304 (FIG. 3), then steps to determine the scaling factor Kscale may be carried out. In order to understand the relationship between the DCO operating point and the scaling factor Kscale, a few theoretical relationships should first be pointed out. To begin with, the gain curves described above with respect to FIG. 2 generally relate to measured versus expected ratios between the counter circuits 108, 110. More specifically, the counter value generated by the PLL output counter 110 (FIG. 1) in the TDC 102 may be sampled on successive reference clock cycles to indicate DCO gain. The number of cycles that the counter has advanced in a single reference clock cycle tells us the frequency of the DCO output clock relative to the reference clock. By comparing this counter value to the nominal, i.e. expected, counter value, the gain of the DCO may be inferred and thereby normalized relative to the nominal DCO gain. In an open loop mode, the counter value "count" is constant and is equal to:

count=output frequency/input frequency(e.g. 4 GHz/ 25 MHz=160)

where:
"output frequency" is the frequency of the PLL output signal, and
"input frequency" is the frequency of the reference clock signal.
Or equivalently:

count=DCO gain*DCO/input frequency

Further, the count value may be viewed as equivalent to a frequency control word, FCW, that is used in a closed loop mode. The FCW is often defined by a setting in the DCO register, such as at 120, whereas during calibration the FCW is determined by the DCO setting. As a result, the relationship above becomes:

$$FCW_{cal}=DCOgain_{nom}*DCO_{cal}/\text{input frequency} \quad (1)$$

The nomenclature "FCW" instead of "counter" is thus used in the following discussion for clarity purposes, especially in a context involving frequency acquisition, more fully discussed below. Additionally, the input frequency may be represented as $F_{ref}/FCWDIV_{cal}$, where $FCWDIV_{cal}$ defines the external frequency division value that divides down the input reference frequency. The relationship then becomes:

$$FCW_{cal}=DCOgain_{nom}*DCO_{cal}*FCWDIV_{cal}/F_{ref}$$

In the above equation, all variables are known except for $DCOgain_{nom}/F_{ref}$ which is used to perform the calibration, so it may be supplied by a run-time register variable stored in, for example, the register storage 120. This may be carried out in step 306 of FIG. 3. Once the variable values are provided, then the value of $FCW_{cal}$ can be determined, at step 308.

After determining an optimal DCO calibration codeword, and utilizing the calibration setting, the $FCW_{cal}$ value is measured to match the nominal gain based upon equation (1) above. However, due to the PVT variation, a different counter value is measured, called $FCW_{measured}$. The $K_{scale}$ variable may then be determined, at step 310 of FIG. 3, via the relationship:

$$K_{scale}=FCW_{measured}/FCW_{cal}$$

A straightforward lookup table stored in storage 118 may be employed for the 1/X relationship exhibited by the above equation, while other implementations for 1/X may be logic based. Note that the $K_{scale}$ variable is specific to the DCO gain in the system, so even if the FCWDIV variable is changed, the $K_{scale}$ value does not change.

For one embodiment, to minimize the PLL lock time, the approximate DCO codeword is determined when the PLL is locked, represented by the variable $DCO_{acq}$, and the output DCO clock phase is set to match the input phase. The DCO setting for frequency acquisition is calculated by scaling the DCO codeword setting that was found in normalization. The scaling accounts for the PVT variation, $K_{scale}$ and the different operating frequency defined by the variable $FCW_{acq}$. The DCO acquisition value may be determined via the following relationship:

$$DCO_{acq}=1/K_{scale}*FCW_{acq}/FCW_{cal}*FCWDIV_{cal}/FCWDIV_{acq}*DCO_{cal}$$

By using the same FCWDIV value for both the calibration and acquisition and substituting for $K_{scale}$, the following expression may be derived:

$$DCO_{acq}=FCW_{cal}/FCW_{measured}*FCW_{acq}/FCW_{cal}*DCO_{cal}$$

Which simplifies to:

$$DCO_{acq}=FCW_{acq}/FCW_{measured}*DCO_{cal}$$

In the above equation, $FCW_{acq}$ is the user's operational FCW value, so this is a straightforward calculation but requires the same 1/X calculation that was used previously.

Generally, in most cases, a user will calibrate with the same FCWDIV as during the frequency acquisition. If this is not the case, then an additional scale factor should be added during frequency acquisition to account for the change in FCWDIV:

$$DIV_{scale}=FCWDIV_{cal}/FCWDIV_{acq}$$

Using this additional scale factor, we get:

$$DCO'_{acq}=DIV_{scale}*DCO_{acq}$$

For one embodiment, and with continued reference to FIG. 3, to achieve ultra-fast PLL lock, the PLL loop-filter is set with both a frequency and phase that are very close to the locked frequency and phase. To minimize the initial phase error, the initial phase of the DCO is set to the same phase, or approximately the same phase, as the input clock reference signal. The DCO phase counter is set to match the phase of the input reference clock signal. Since the DCO counter value is literally set to match, or close to matching, the input reference clock signal phase, there is almost no phase locking required by the PLL. By calculating the DCO acquisition codeword, and by setting the DCO counter phase, the PLL may be started in an "almost locked" state which greatly reduces the PLL lock time.

As explained above, the approximate locked PLL frequency is pre-determined and used to start the PLL, at 312, and the DCO started at an almost zero phase error relative to the reference clock, at 314. Mechanically, this means that we set the DCO codeword to $DCO_{acq}$ and set the DCO phase to match the phase of the reference clock. Simulations indicate that we can lock in less than 30 reference clock cycles, whereas without this acquisition logic the lock time is approximately 90 reference clock cycles with our digital implementation. Most other PLL design implementations lock in many hundreds of clock cycles.

In a further embodiment, an alternative DCO gain normalization process may be carried out that has added flexibility over the embodiments described above. Specifically, the following discussion describes a DCO gain normalization process that may be accomplished even if a DCO codeword of "zero" corresponds to a frequency other than zero.

Figure 4:
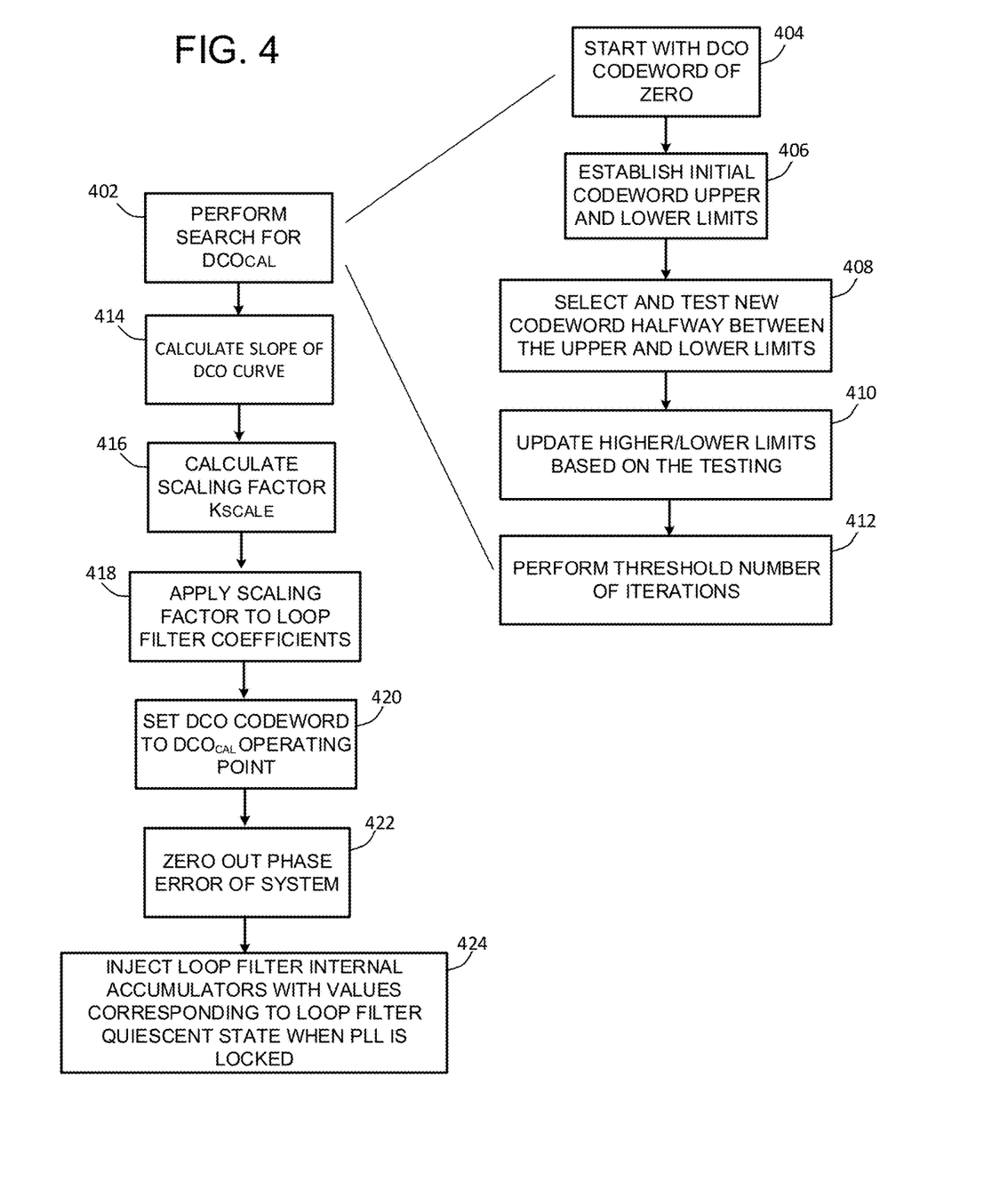
FIG. 4 illustrates a flowchart of steps illustrating an embodiment of an ultrafast locking method utilizing the PLL of FIG. 1.

Referring now to FIG. 4, a method of normalizing DCO gain involves first finding the optimal operating point on the DCO frequency curve, at 402. For one embodiment, the optimal operating point is the DCO codeword value that produces the closest output frequency to the desired output frequency. This may be found by a hardware state machine through an iterative search similar to that described above.

Alternatively, and further referring to FIG. 4, the search may involve starting with a DCO codeword value of "0", at 404, and stepping up the frequency in small step sizes to ensure that it does not cause timing violations as it moves to the next higher frequency. Initially, the small step sizes are used to establish initial codeword upper and lower limits, at 406. At each step, the method determines if the output counter running on the DCO clock is faster or slower than the expected DCO code. If it is slower, then it marks the current DCO code value as a "lower limit", and checks a DCO code value higher than the current DCO code. If it is faster, then it marks the current DCO code value as an "upper limit", and checks a DCO code value lower than the current DCO code. Once the "upper limit" has been found, the method tests a new DCO codeword that is half-way between the current "lower-limit" and the current "upper limit", at 408. Depending on whether the resulting frequency is faster or slower than the expected frequency, the upper and lower limits are updated, at 410. For one embodiment, the "halfway" code selection, testing, and limit updating steps are iterated, at 412, until the higher limit and lower limit reside on each side of a remaining codeword, thus identifying the DCO codeword operating point $DCO_{CAL}$. For other embodiments, the number of iterations may be constrained by a threshold number to balance speed versus accuracy.

For some embodiments, when performing the binary search, the state machine assumes that a higher DCO codeword corresponds to a higher output frequency. If it ever finds that a higher frequency causes a lower DCO count value, then it assumes that this is due to a timing violation and it stops the search and uses the previously valid "lower limit" value.

Once the operating point is determined, a slope of the DCO curve at the operating point is calculated. This represents the gain of the DCO at the operating point. The gain is the change in the DCO output frequency for each step in the DCO code. For one embodiment, this involves selecting a DCO codeword value that is "N" DCO codeword values away from the operating point, and driving the DCO with the offset codeword value. This is done to increase the difference in counts and to average the slope of the curve through a wider portion of the gain curve. The count value for the frequency associated with the offset codeword value is then determined, and the slope "$m_{actual}$" determined, at 414, by the following relationship:

$$m_{actual} = (count_{op} - count_{offset}) / (offset * clkref_{cycles})$$

where:
$count_{op}$ is the number of DCO counts at the operating point frequency,
$count_{offset}$ is the number of DCO counts at the DCO code that is offset from the operating point frequency,
offset is the difference in the DCO codeword values at the operating point and the offset, and
$clkref_{cycles}$ is the number of clkref cycles over which the DCO counter runs.

For one embodiment, in order to measure the frequency of the DCO at each code, the processing circuitry of the loop filter measures the number of DCO counts that have occurred in a given number of "m" reference clock cycles. In one specific embodiment, the processing circuitry may average the number of counts running on the oscillator clock over sixteen reference clock cycles. The number of counts thus measures how far a counter running on the DCO clock has advanced during the m reference cycles, and accounts for wrap-around in the counter running on the DCO clock.

Once the slope of the actual frequency curve has been calculated, the scaling factor $k_{scale}$ may then be calculated, at 416, by taking the ratio of $m_{nominal}$ to $m_{actual}$, where $m_{nominal}$ is the ratio of the DCO frequency change to the change in DCO codeword, and represents the difference in the number of DCO counts that should occur per DCO codeword difference, in other words, the slope of the DCO frequency curve. In specific implementations, the value for $m_{nominal}$ is a fixed point number with fractional precision as defined by system parameters. In general, the greater the slope of the true frequency curve as compared to the nominal curve, the smaller the scaling factor $k_{scale}$.

Once the scaling factor is determined, it may then be applied to the loop filter control coefficients Ki and Kp, at 418, to generate normalized loop filter coefficients as substitutes for the nominal ones. As noted above, the loop filter includes storage that allows for configurability or programmability of loop filter coefficients such as the integral and proportional coefficients Ki and Kp. The internal storage of the loop filter may also store a start value, derived from the calibration DCO control word determined from the above steps. The start value may correspond to the calibration DCO code word such that it matches the value to the codeword, or forms a fractional value of the DCO codeword, for example. Nominal values for the integral and proportional coefficients Ki and Kp may generally be programmed prior to the initialization process described above. By applying the scaling factor to those nominal values, scaled or calibrated values for Ki and Kp may be used as replacements for the nominal values, thereby normalizing the DCO gain for the PLL.

For some embodiments, the gain curve is only normalized in a region of the operating point. This reduces the time needed to perform the initialization process. Other embodiments may normalize the entire curve and store the normalized coefficient values and/or the $K_{SCALE}$ factor for future use. This would effectively map the curve and allow for quick locking when changing from one frequency to another.

Once the scaling factor has been calculated and applied to the loop filter coefficients, the PLL may be operated to go into a locked state almost immediately, in a similar manner as that described above. With continued reference to FIG. 4, the stored start value corresponding to the calibration DCO codeword value (the DCOcal operating point) is fed into the loop filter, at 420. The loop filter is then started in an initial state where the phase-error (typically associated with an operating PLL) is zeroed out of the system, at 422. This may be accomplished by forcing the loop filter into an initial state where its phase is matched to the phase of the oscillator. This forces a phase lock between the DCO counter and the reference counter in the loop filter. The internal accumulators and registers, of the loop filter are then injected with values that are close to quiescent values exhibited while the PLL is in a locked state, at 424.

By locking the PLL in this manner, the control loop is effectively locked immediately since the correct frequency has been selected via the calibration DCO control word found during normalization, and the phase error is forcibly reduced close to zero. In addition, by starting the control loop close to its quiescent state, it does not require time to ramp up to the point at which the internal loop filter accumulators contain their steady-state values (the quiescent state). Setting the internal loop filter phase to match the output clock phase allows for zeroing out of the phase error, while also not altering the phase of the output clock generated by the oscillator. In this way, a jump to a locked state may be accomplished without changing the phase of the output clock.

Figure 5:
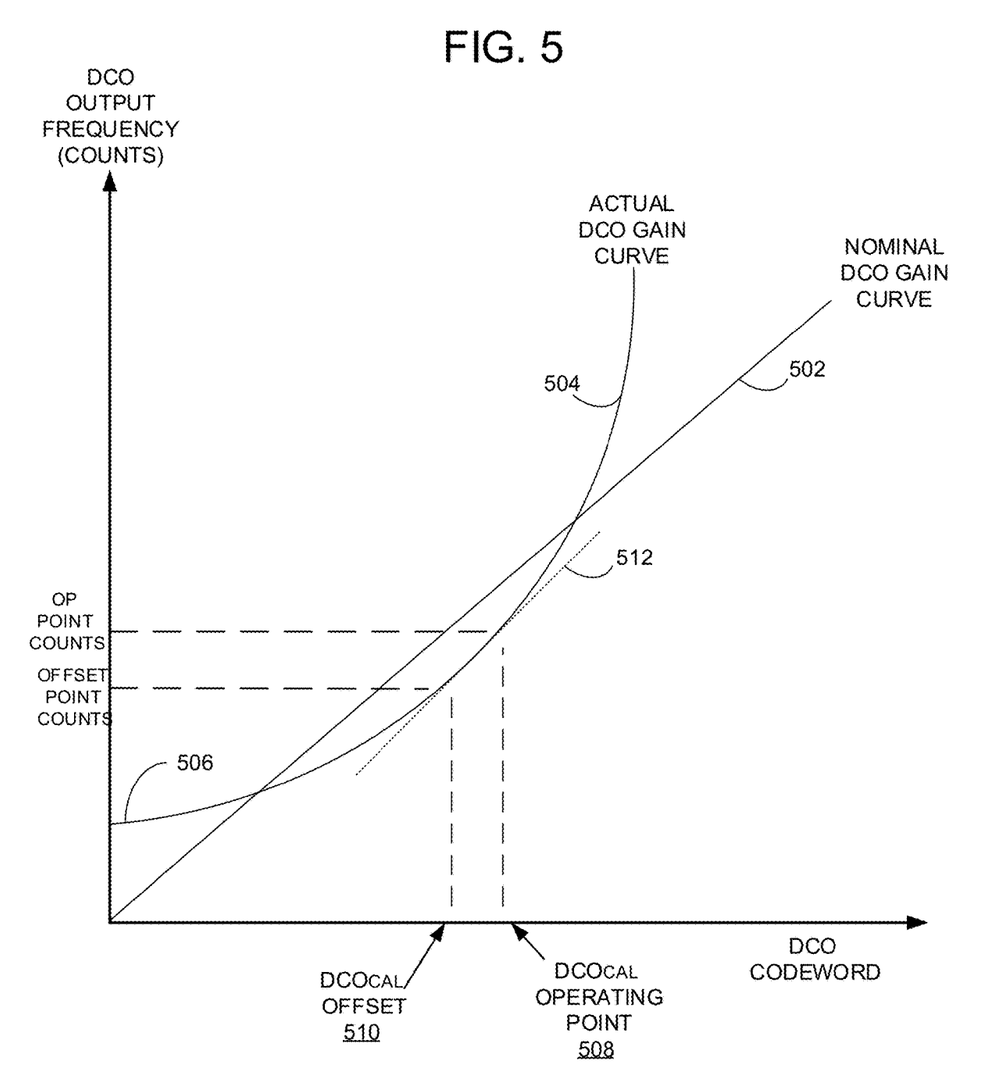
FIG. 5 illustrates actual and measured curves that plot DCO codeword values versus DCO frequency/count values.

FIG. 5 illustrates a graphical representation of various points and curves associated with the DCO normalization process described above with respect to FIG. 4. The X-axis of the curve represents DCO codeword values, while the Y-axis represents the DCO output frequency in terms of counts (such as counted by counter 110 of FIG. 1, during a given time interval). A nominal DCO gain curve, at 502, is overlaid on an actual DCO gain curve, at 504. In many situations, a DCO control word specifying all zeros may correspond to a frequency other than zero, as shown at 506. Further, the actual DCO curve may exhibit a nonlinear relationship between DCO control values and frequency. The $DCO_{CAL}$ operating point is shown, at 508, with the "N" codeword steps resulting in an offset from the $DCO_{CAL}$ operating point shown at 510. The scaling factor, $K_{SCALE}$ is shown as the slope of the tangent to the actual DCO gain curve within the region defined by the $DCO_{CAL}$ operating point and the offset, at 512.

For some embodiments, the frequency search methods described above may be further enhanced by adaptively varying one or more accuracy parameters during the search. For instance, during the early stages of the DCO calibration frequency search, the DCO frequency generally highly deviates from the desired frequency. For such circumstances, only a low accuracy measurement is needed. As the DCO frequency approaches the desired frequency, a more accurate frequency measurement is desired to detect the difference between the current frequency and the desired frequency. However, increasing the accuracy of the measurement correspondingly increases the frequency search time.

Figure 6:
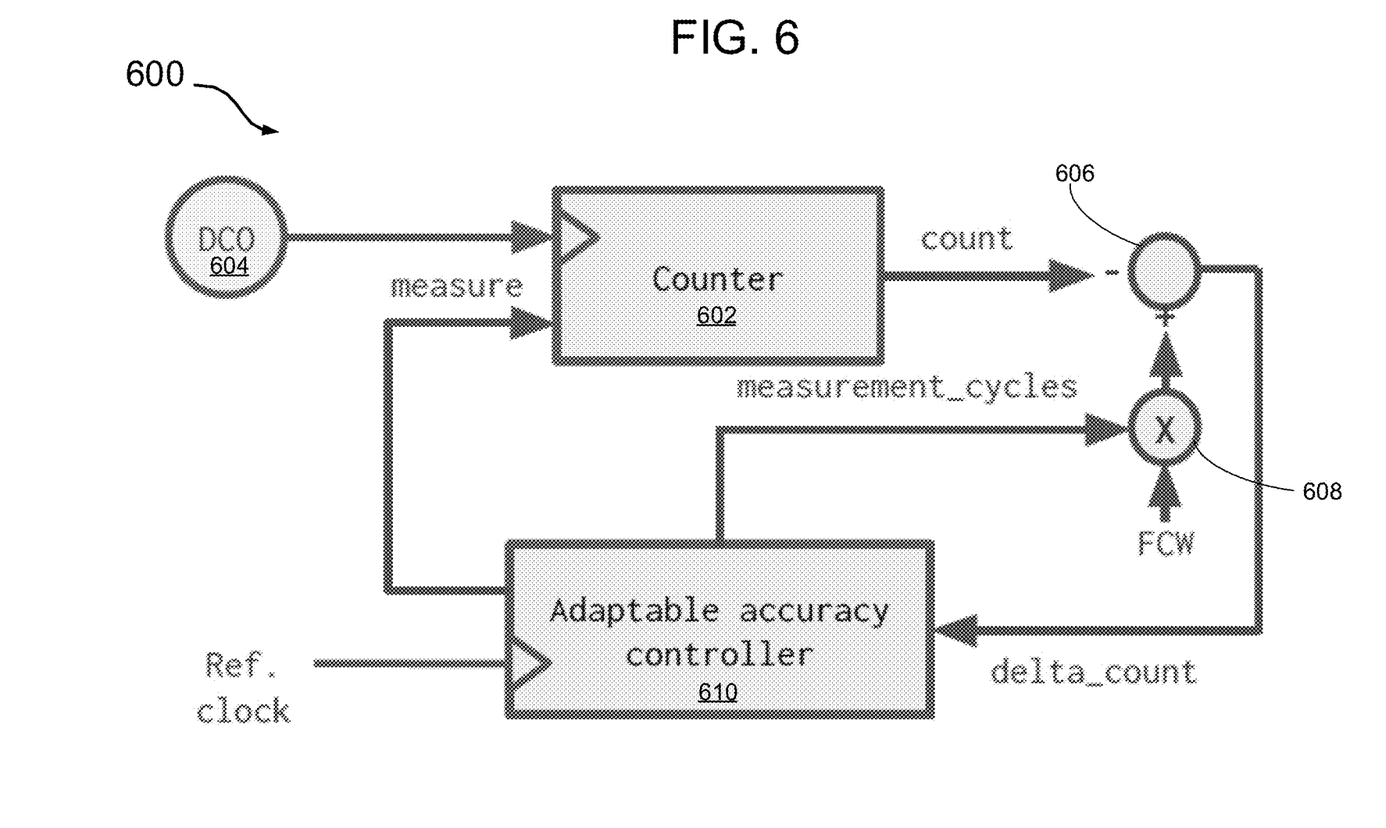
FIG. 6 illustrates a block diagram for one embodiment of a circuit for carrying out an adaptable accuracy frequency measurement.

FIG. 6 illustrates one embodiment of a frequency measurement circuit, generally designated 600, that adaptively changes a measurement parameter based on a detected threshold value so that the time to carry out a frequency search may be significantly reduced. The frequency measurement circuit 600 includes a counter 602 that receives a DCO clock signal DCOCLK from a DCO 604, and a measurement signal "measure" having a controllable measurement interval Tm. The counter 602 operates to generate a count "count" representing, for one embodiment, a number of rising edges of the DCO clock DCOCLK within the measurement signal interval Tm. In other embodiments, falling edges could be counted in addition to or instead of the rising edges. The count "count" is fed to a summing circuit 606 which sums the count with a value generated by multiplying, at 608, a target frequency value FCW with a control signal "measurement_cycles" representing a number of measurement cycles to arrive at a target count.

Further referring to FIG. 6, the summing circuit 606 generates a difference value "delta_count" that serves as a control input for an adaptable accuracy controller 610. The adaptable accuracy controller 610 generates the measurement signal "measure" and controls the timing duration Tm of the measurement signal. The adaptable accuracy controller 610 receives a reference clock input "Ref clock" and generates the measurement signal "measure" based on a threshold value of the difference value "delta_count." When the difference value is relatively high, then the measurement signal interval Tm is relatively shorter, with a lower accuracy result, but resulting in faster computation performance. Conversely, as the difference value goes low, then the measurement signal timing interval Tm is lengthened to confirm the count at a high level of accuracy during one or more final iterations of the search.

Figure 7:
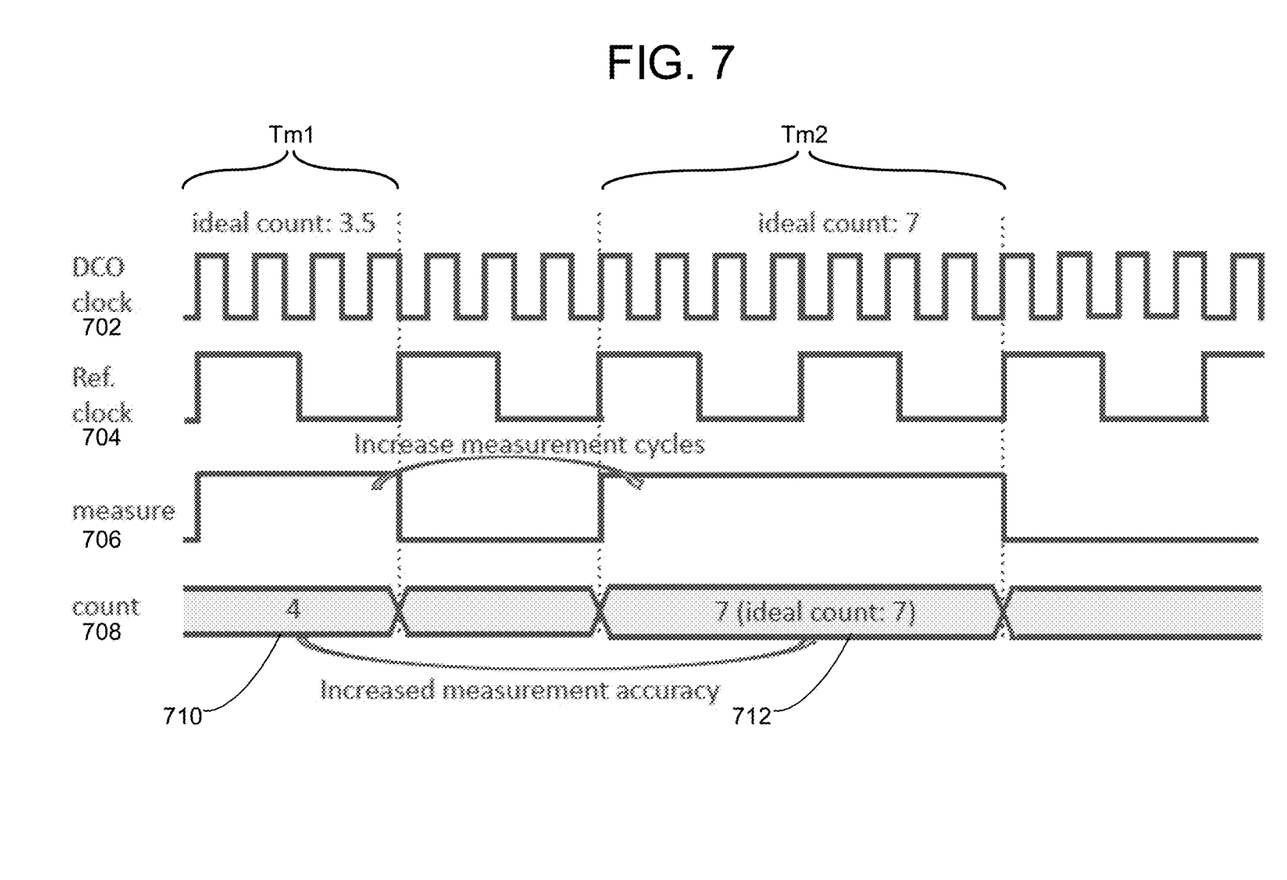
FIG. 7 illustrates one embodiment of a frequency search timing diagram for the circuit of FIG. 6 illustrating a count of DCO clock edges within different measurement periods.

FIG. 7 illustrates one embodiment of a timing diagram illustrating the relative timing between many of the signals described above with respect to FIG. 6. The topmost waveform corresponds to the DCO clock 702. Underneath the DCO clock is the reference clock 704. Generally, the DCO clock is an integer number of cycles of the reference clock. Under the reference clock 704 is the measurement signal 706, generated by the adaptable accuracy controller 610. The count value "count" is then represented by the last waveform "count" 708.

As shown in FIG. 7, a first accuracy setting is seen during timing interval Tm1, which spans four cycles of the DCO clock, a single cycle of the reference clock, and a single measurement signal interval spanning the single cycle of the reference clock. The corresponding count is shown at 710, representing a count of four rising edges of the DCO clock during the measurement signal interval Tm1. A second accuracy setting resulting in a higher accuracy count is shown during timing interval Tm2, which spans rising edges of the DCO clock, and two cycles of the reference clock. Noticeably apparent is the increase in the measurement timing interval Tm2, which is twice the interval of the immediately preceding measurement signal interval Tm1. The corresponding count is shown at 712, representing a count of seven rising edges of the DCO clock during the measurement signal interval Tm2.

Figure 8:
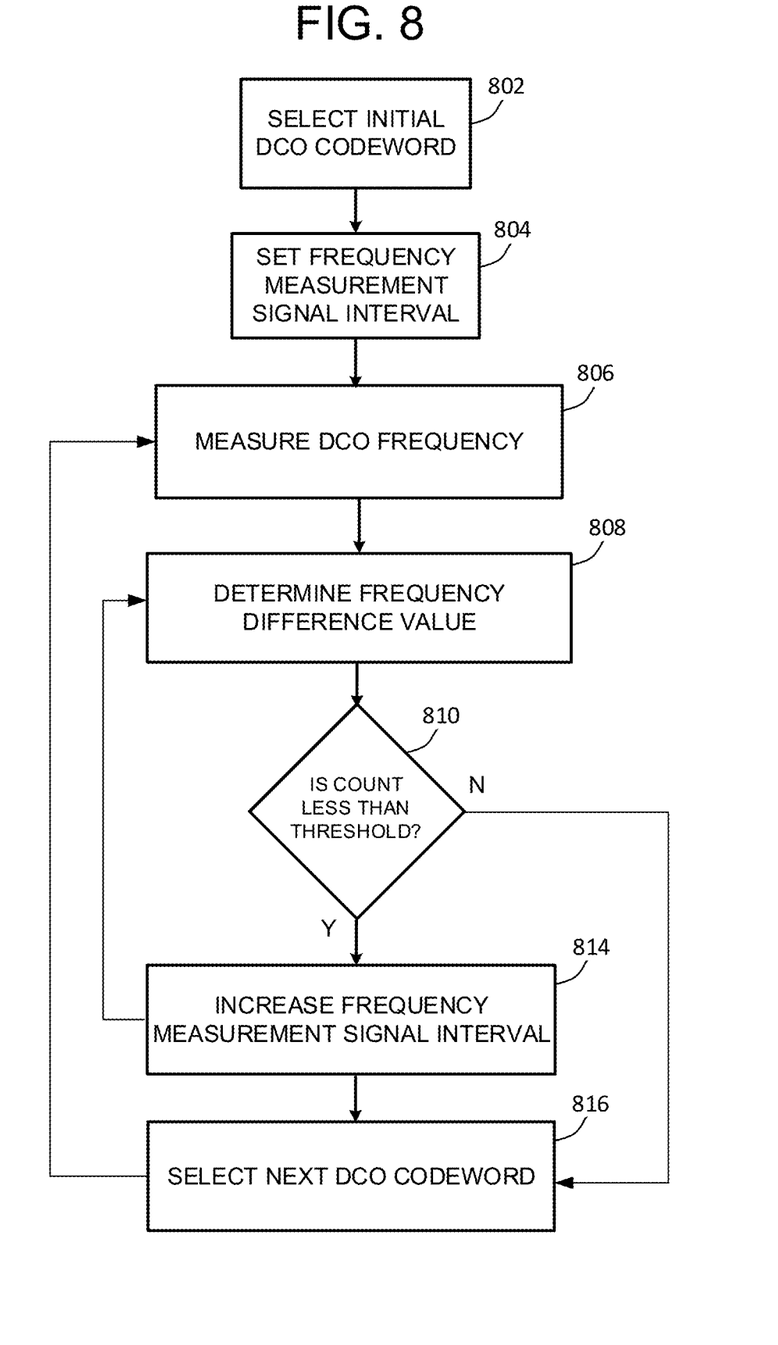
FIG. 8 illustrates steps for one embodiment of a method of adaptively varying accuracy parameters for carrying out a frequency search using the circuitry of FIG. 6.

FIG. 8 illustrates a flowchart of steps employed for one embodiment of an adaptive accuracy frequency search method corresponding to the circuitry and timing shown in FIGS. 6-7. The search starts with the setting of an initial DCO codeword, at 802, and an initial minimum observation period of one measurement cycle, at 804. At 806, the counter measures the DCO frequency. At 808, the frequency difference value "delta_count" is calculated to determine how far the current frequency is away from the target frequency. A determination is then made, at 810, as to whether the absolute value of the difference count is less than a threshold TH. If the absolute value of the difference count is greater than the threshold TH, indicating a low-accuracy scenario, then the method may proceed to a next DCO codeword in the search, at 816, and a repeating of the measuring and calculating steps 806 and 808. If the absolute value of the difference count is less than the threshold TH, indicating a high-accuracy scenario, then the interval of the measurement signal is increased, at 814, and a next codeword evaluated, at 816.

Figure 9:
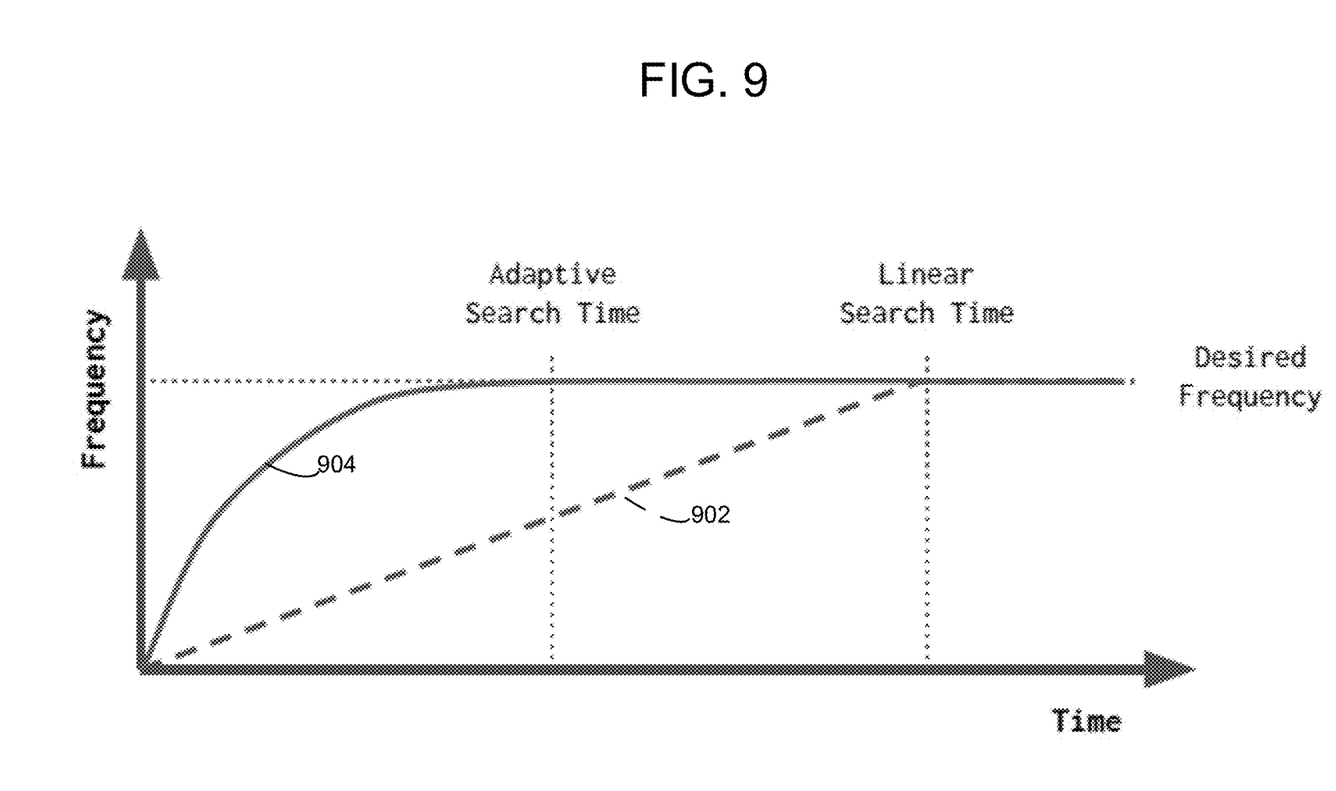
FIG. 9 illustrates a graph illustrating the beneficial impact to frequency search time as a result of using the circuit and method of FIGS. 6-8.

FIG. 9 graphically illustrates how the adaptive accuracy frequency measurement circuit 600 improves the performance and efficiency of the frequency search. A strict linear search, shown at 902, would set a fixed observation period based on the highest accuracy requirement during the entire frequency search. As a result, the measurement time is inefficiently allocated to DCO frequencies that are remote from the target frequency (where high accuracy is unnecessary). Since the overall search time corresponds to the number of search iterations, the overall search time is highly sensitive to various design parameters such as the DCO frequency range, the search algorithm type, and the search starting point. On the other hand, the adaptive accuracy frequency measurement search, represented by the curve at 904, starts with a minimum observation period so that DCO frequencies that are remote from the target frequency can be evaluated efficiently. As the DCO frequency progresses closer to the target frequency, the observation period increases gradually to account for the higher accuracy requirement. Overall, less time is spent on off-target DCO frequencies, and more time is spent on near-target frequencies, effectively speeding up the frequency search. As a result, the search time is less sensitive to a wider search range or sub-optimal starting points since most of the search time is spent addressing near-target frequencies.

For some embodiments, the frequency search may be aided by circuitry that is capable of detecting timing violations during the search. In some situations, the counter circuitry used to measure the DCO output frequency may be susceptible to timing violations, possibly causing the counter circuitry to produce random results that are outside the range of expected results. One example involves a situation where a subsequent codeword that is higher than a previous codeword is measured as having a frequency that is lower than the previous codeword (with an expectation that higher codewords are associated with higher frequencies). Such results typically force the search to restart. Consequently, many frequency search techniques employ a "slower" algorithm to reduce the risks of timing violations.

Figure 10:
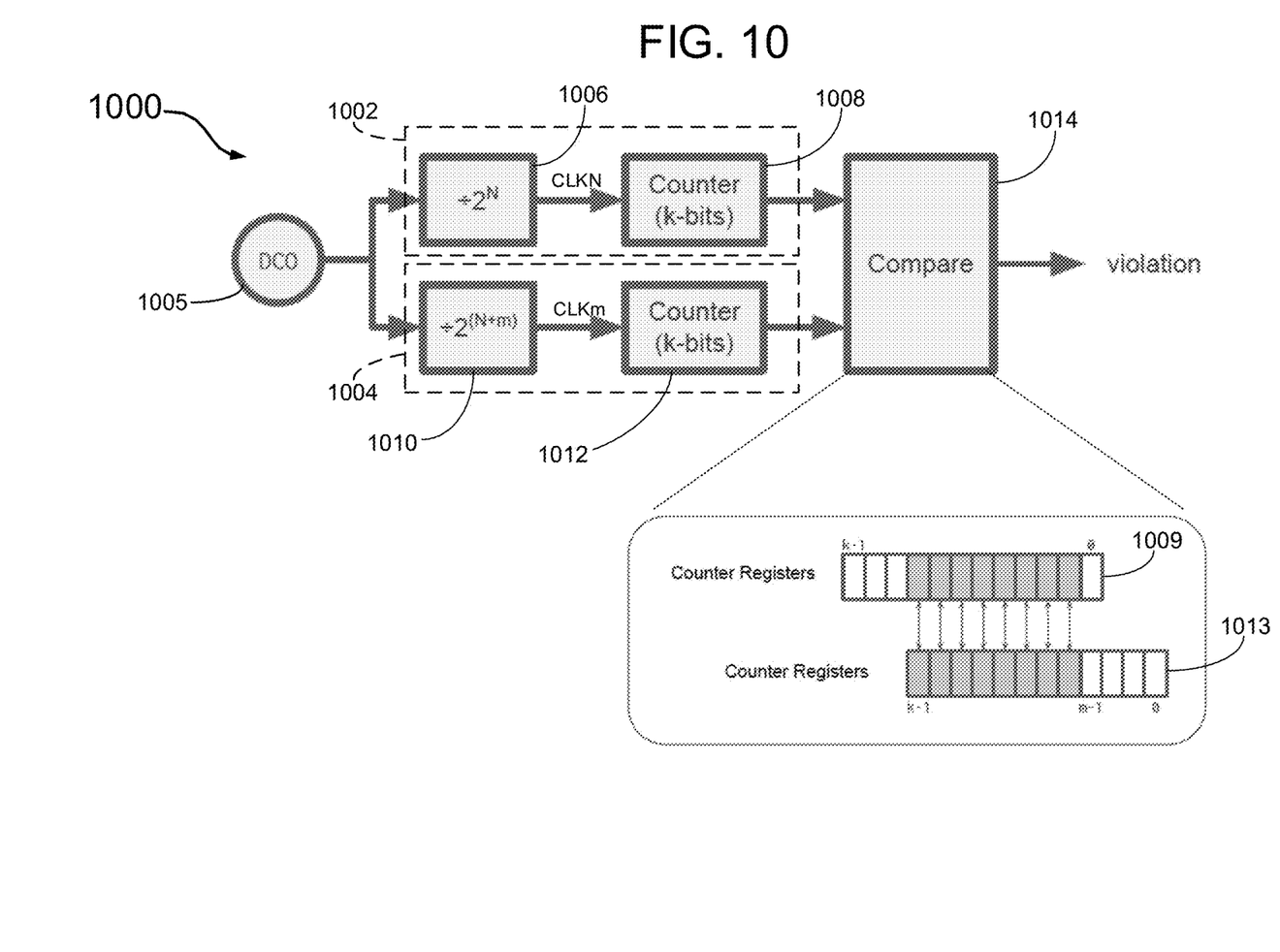
FIG. 10 illustrates one embodiment of a frequency counter circuit to detect timing violations.

FIG. 10 illustrates a frequency counter circuit, generally designated 1000, that incorporates timing violation circuitry to detect timing violations, allowing for a sweep of the entire frequency range of the DCO in a binary search without the risk of exceeding the maximum operating frequency of the counter circuits. This enables a relaxation of constraints on the counter circuitry, and allows the frequency search algorithm to operate at significantly faster speeds.

Further referring to FIG. 10, the frequency counter circuit 1000 incorporates first and second counter paths 1002 and 1004 that each receive a clock signal from a digitally-controlled oscillator (DCO) 1005. The first counter path 1002 includes a first pre-divider 1006 with a first divider ratio of, for example, N, to slow the received DCO clock frequency to a first reduced clock signal CLKN having a first reduced frequency that is less than the DCO frequency by a ratio corresponding to the value N. A first counter 1008 receives the first reduced clock signal and employs a first k-bit register 1009 to count the first reduced clock edges during a selected time interval to generate a first count value.

With continued reference to FIG. 10, the second counter path 1004 includes a second pre-divider 1010 with a second divider ratio of, for example, N+m, to slow the received DCO clock frequency to a second reduced clock signal CLKm having a second reduced frequency that is less than the DCO frequency by a ratio corresponding to the value N+m, which is m times slower than the first reduced clock signal CLKN. A second counter 1012 receives the second reduced clock signal CLKm and employs a second k-bit register 1013 to count the second reduced clock edges during the selected time interval to generate a second count value.

Figure 11:
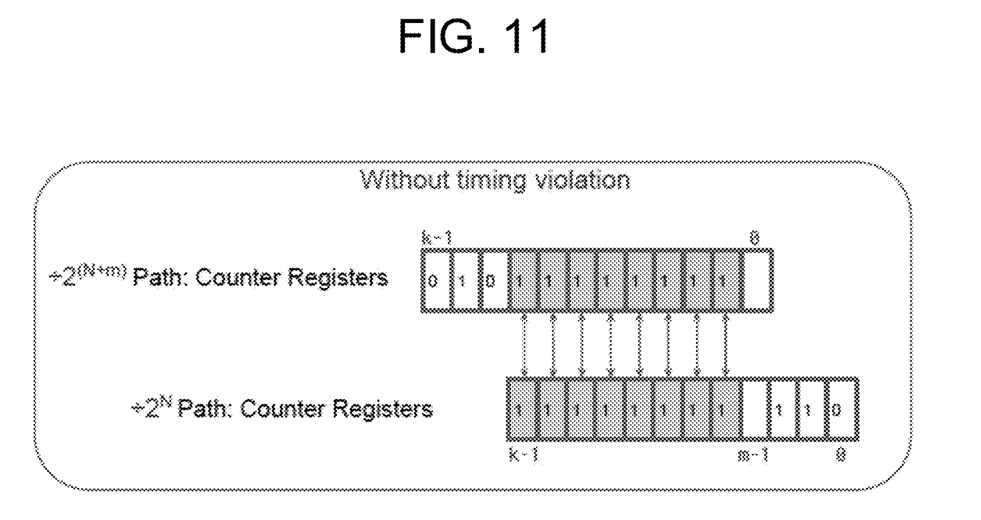
FIG. 11 illustrates the timing registers of FIG. 10 showing a comparison result that doesn't involve timing violation.
Figure 12:
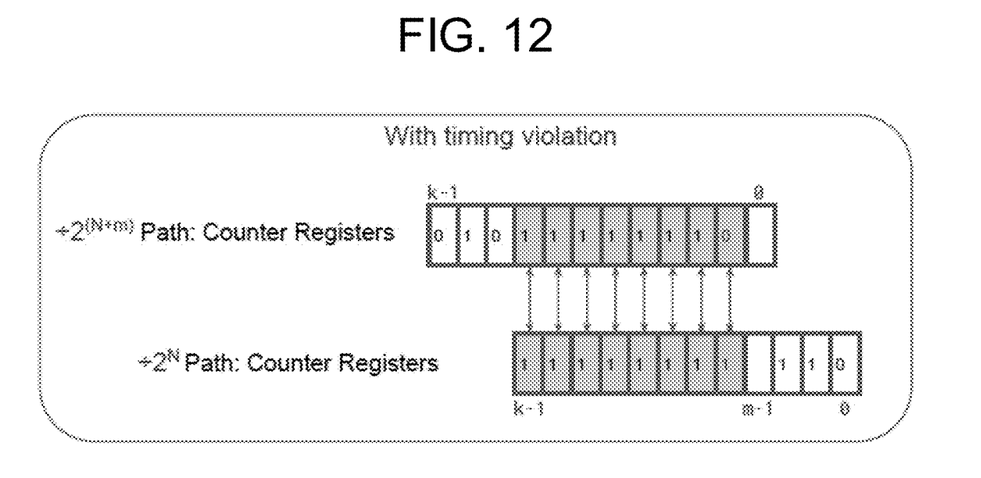
FIG. 12 illustrates the timing registers of FIG. 10 showing a comparison result that involves a timing violation.

Further referring to FIG. 10, the first count value and the second count value are each represented by k bits of the respective counter registers 1009 and 1013, with the first count value being exactly m times larger than the second count value (in the absence of a timing violation). When the division value of the first pre-divder 1006 in the first counting path 1002 is a power of two, such as $2^N$ (i.e. 1, 2, 4, 8, 16, etc), and the division value for the second pre-divider 1010 is a larger power of two, such as $2^{N+m}$ (i.e., 1, 2, 4, 8, 16, etc), the relative MSBs of the two count values should match exactly in the absence of a timing violation. When the division ratios are precisely powers of two, say $2^N$ and $2^{N+m}$, then the second count value should appear as a shifted version of the first count value where the value is shifted by m bits. When the division ratios are not precisely powers of the two, say N and N+m, then the second count value should appeared scaled by a factor of n/(N+m). As long as the number of bits in the counters, k, is sufficient to prevent continuous overflow, the counters can accurately measure the DCO frequency. The two count values are then fed to a comparison circuit 1014, which compares the MSB values on a bit-by-bit basis to determine whether any mismatch of bits has occurred. A complete matching of the bits confirms the lack of a timing violation, such as that shown in FIG. 11, while any mismatch in the bits indicates a timing violation, as shown in FIG. 12. A resulting timing violation results in a discarding of the associated DCO codeword, where it is substituted for another. Where no timing violation is detected, the output of the first counter 1008 is utilized as a valid frequency measurement.

The frequency counter circuit 1000 described above provides a relatively wide detection range. As long as the respective pre-divider circuits 1006 and 1010 are able to function at maximum DCO frequencies across all process-voltage-temperature (PVT) variations, one can choose an appropriate value for "m" such that any timing violations within the DCO frequency range can be detected. This greatly relaxes design constraints for the counter circuitry, since one need only design counters for the maximum targeted DCO frequency, rather than the entire DCO frequency range across the PVT variations. More importantly, faster and wider range frequency search algorithms may be used without the risk of measurement errors due to frequency overshoot.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A frequency measurement circuit, comprising:
    a counter circuit to receive a first digitally-controlled oscillator (DCO) clock signal corresponding to a first DCO input codeword and a measurement signal, the counter circuit responsive to the measurement signal to generate a count representing a measured frequency of the first DCO clock signal; and
    a control circuit configured to selectively adjust a parameter of the measurement signal for generating a second count of a second DCO clock signal corresponding to a subsequently selected DCO input codeword, the control circuit to selectively adjust the parameter based on a received control signal.

2. The frequency measurement circuit of claim 1, wherein:
    the parameter comprises a timing parameter associated with the measurement signal.

3. The frequency measurement circuit of claim 2, wherein:
    the timing parameter comprises a timing interval over which the measurement signal is asserted.

4. The frequency measurement circuit of claim 3, wherein:
    the counter circuit is responsive to the measurement signal to generate the count solely during the timing interval over which the measurement signal is asserted.

5. The frequency measurement circuit of claim 1, wherein the control circuit further comprises:
    a summing circuit to receive the count and a target frequency value, and wherein the control signal comprises a value representing a difference between the measured count and a target count corresponding to the target frequency value.

6. The frequency measurement circuit of claim 1, wherein:
    the control circuit adjusts the parameter in response to the control signal exceeding a threshold value.

7. The frequency measurement circuit of claim 1, wherein:
    the counter circuit is configured to count rising edges of the DCO clock signal in response to receiving the measurement signal.

8. A method, comprising:
    receiving a first digitally-controlled oscillator (DCO) clock signal corresponding to a first DCO input codeword and a measurement signal with a counter circuit;
    generating a count representing a measured frequency of the first DCO clock signal in response to the measurement signal; and
    selectively adjusting a parameter of the measurement signal with a control circuit for generating a second count of a second DCO clock signal corresponding to a subsequently selected DCO input codeword, the selectively adjusting of the parameter based on a received control signal.

9. The method according to claim 8, wherein the parameter comprises a timing parameter associated with the measurement signal.

10. The method according to claim 9, wherein the timing parameter comprises a timing interval over which the measurement signal is asserted.

11. The method according to claim 10, wherein the generating of the count is carried out solely during the timing interval over which the measurement signal is asserted.

12. The method according to claim 8, wherein the selectively adjusting further comprises:
    summing the count and a target count corresponding to a target frequency value to generate a difference value; and
    wherein the control signal comprises the difference value.

13. The method according to claim 8, wherein the selectively adjusting further comprises:
    adjusting the parameter in response to the control signal exceeding a threshold value.

14. The method according to claim 8, wherein the generating of the count further comprises:
    counting rising edges of the DCO clock signal in response to receiving the measurement signal.

15. A method of searching for a digitally-controlled oscillator codeword corresponding to a target frequency value, the method comprising:
    selecting an initial DCO codeword to generate a corresponding initial DCO clock signal;
    generating a first frequency measurement signal having a first measurement interval, the measurement interval enabling a frequency measurement of the first DCO clock signal with a first accuracy during the measurement interval;
    performing the frequency measurement during the first measurement interval to generate a measured frequency value; and
    selectively adjusting the measurement interval to an adjusted interval for a subsequently selected DCO codeword based on a control signal, the adjusted interval having an associated accuracy that is different than the initial accuracy.

16. The method of claim 15, wherein the measured frequency value comprises a count that is generated during the first measurement interval.

17. The method of claim 15, wherein the control signal comprises:
    a difference value between the measured frequency value and an expected frequency value corresponding to the target frequency.

18. The method of claim 17, wherein the adjusting of the measurement interval further comprises:
 adjusting the measurement interval to an adjusted interval for a subsequently selected DCO codeword based on a control signal exceeding a threshold value.

\* \* \* \* \*